United States Patent
Yoneyama et al.

(10) Patent No.: US 9,657,915 B2
(45) Date of Patent: May 23, 2017

(54) ILLUMINATION DEVICE AND SURFACE LIGHT EMISSION MODULE

(71) Applicant: KONICA MINOLTA, INC., Chiyoda-ku (JP)

(72) Inventors: Masatoshi Yoneyama, Izumi (JP); Nobuya Miki, Ibaraki (JP); Yasuhiro Sando, Amagasaki (JP); Junya Wakahara, Settsu (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 15/122,065

(22) PCT Filed: Mar. 25, 2015

(86) PCT No.: PCT/JP2015/059033
§ 371 (c)(1),
(2) Date: Aug. 26, 2016

(87) PCT Pub. No.: WO2015/147023
PCT Pub. Date: Jan. 10, 2015

(65) Prior Publication Data
US 2017/0038026 A1    Feb. 9, 2017

(30) Foreign Application Priority Data
Mar. 26, 2014    (JP) .................. 2014-063757

(51) Int. Cl.
*H05B 33/08*    (2006.01)
*F21V 3/00*    (2015.01)
*F21V 23/00*    (2015.01)
*F21V 31/00*    (2006.01)
*F21V 23/06*    (2006.01)

(52) U.S. Cl.
CPC .............. *F21V 3/00* (2013.01); *F21V 23/001* (2013.01); *F21V 23/06* (2013.01); *F21V 31/005* (2013.01)

(58) Field of Classification Search
CPC .......... F21V 3/00; F21V 23/001; F21V 23/06; H05B 33/08; H05B 33/0815; H05B 33/0845; H05B 33/0884; H05B 37/02; H05B 37/0227; H05B 37/0272; H05B 37/0281; H05B 37/00
USPC .. 315/169.1–169.3, 291, 307, 308, 312, 360
See application file for complete search history.

(56) References Cited

U.S. PATENT DOCUMENTS 9,215,761 B2 *    12/2015    van de Ven ............ H05B 33/02

FOREIGN PATENT DOCUMENTS

| JP | 2012-4008 | 1/2012 |
| JP | 2013-182831 | 9/2013 |
| WO | WO 2013/146764 | 10/2013 |

* cited by examiner

*Primary Examiner* — Jimmy Vu
(74) *Attorney, Agent, or Firm* — Cozen O'Connor

(57) ABSTRACT

In an illumination device, a surface light emission module includes a panel power input unit connected to a base power input unit and a panel power output unit connected to a base power output unit for supplying power to a surface light emission panel. A connection panel, by being installed in an unselected scheduled light emission region, directly connects the base power input unit to the base power output unit.

8 Claims, 17 Drawing Sheets

ILLUMINATION DEVICE AND SURFACE LIGHT EMISSION MODULE

RELATED APPLICATIONS

This is a U.S. National Phase Application under 35 USC 371 of International Application PCT/JP2015/059033 filed on Mar. 25, 2015.

This application claims the priority of Japanese application no. 2014-63757 filed Mar. 26, 2014, the entire content of which is hereby incorporated by reference.

TECHNICAL FIELD

The present invention relates to a structure of an illumination device using a plurality of surface light emission panels and a structure of a surface light emission module.

BACKGROUND ART

In recent years, there has been proposed an illumination device using an organic electroluminescence element (surface light emission panel). In a case where it is necessary to increase a size of the illumination device, it may be achieved by increasing a size of the surface light emission panel. This, however, may lead to problems such as increased size of a manufacturing apparatus and a lower yield rate. Accordingly, in WO 2013/146764 A (Patent Literature 1), the size of the illumination device is increased by arranging a plurality of surface light emission panels, each having a size easy to be manufactured, in a plane.

CITATION LIST

Patent Literature

Patent Literature 1: WO 2013/146764 A

SUMMARY OF INVENTION

Technical Problem

In the above-described Patent Literature 1, a configuration is used in which an entire illumination device is made to emit light by the plurality of surface light emission panels. However, in some cases, it is not necessary to make the entire illumination device to emit light from a design perspective, and it is necessary to meet a request for making a selected region thereof to emit light by the surface light emission panels.

Thus, the present invention has been devised in view of the above-described problem, and an objective thereof is to provide an illumination device and a surface light emission module with which it is possible to make the selected region thereof to emit light by the surface light emission panels.

Solution to Problem

According to an illumination device based on the present invention, the illumination device includes: one or more surface light emission modules including a surface light emission panel emitting light by being supplied with power; a panel base partitioned into two or more scheduled light emission regions and configured to make the surface light emission panel to emit light by installing the surface light emission module in the selected scheduled light emission region; a power passing means configured to pass the power from the adjacent scheduled light emission region; and a power supply configured to supply the power to the surface light emission panel.

Each of the scheduled light emission regions has a base power input unit and a base power output unit, and by the base power output unit being connected to the base power input unit between adjacent scheduled light emission regions, a series connection line is constituted of the power supply and the two or more scheduled light emission regions, the surface light emission module includes a panel power input unit connected to the base power input unit and a panel power output unit connected to the base power output unit for supplying the power to the surface light emission panel, and the power passing means passes the power from the adjacent scheduled light emission region by directly connecting the base power input unit to the base power output unit.

According to another aspect, the power supply is a constant current power supply, and the constant current power supply and the two or more scheduled light emission regions constitute a constant current series connection line.

According to another aspect, the power supply includes a first constant current power supply and a second constant current power supply, and a first constant current series connection line connected to the first constant current power supply and a second constant current series connection line connected to the second constant current power supply are disposed in parallel to each other.

According to another aspect, the base power input unit includes a first base power input unit and a second base power input unit, the base power output unit includes a first base power output unit and a second base power output unit, the first constant current power supply, the first base power input unit, and the first base power output unit constitute the first constant current series connection line, the second constant current power supply, the second base power input unit, and the second base power output unit constitute the second constant current series connection line, and the surface light emission module includes a first surface light emission module and a second surface light emission module.

The first surface light emission module includes: a first light emission line connected to the first constant current series connection line and supplying power to the surface light emission panel in a state where the first surface light emission module is installed in the scheduled light emission region; and a first connection line connected to the second constant current series connection line and constituting the power passing means by directly connecting the second base power input unit to the second base power output unit.

The second surface light emission module includes: a second connection line connected to the first constant current series connection line in a state where the second surface light emission module is installed in the scheduled light emission region and constituting the power passing means by directly connecting the first base power input unit to the first base power output unit; and a second light emission line connected to the second constant current series connection line and supplying power to the surface light emission panel.

The surface light emission module further includes a connection panel as the power passing means having, in a state where installed in the scheduled light emission region, a first connection line connected to the first constant current series connection line and directly connecting the first base power input unit to the first base power output unit, and a second connection line connected to the second constant current series connection line and directly connecting the second base power input unit to the second base power output unit.

According to another aspect, the connection panel includes a non-emission dummy panel having the same shape as that of the surface light emission module.

According to another aspect, the illumination device further includes: a first switching member as a power passing means connected to the first constant current power supply and a second switching member as a power passing means connected to the second constant current power supply provided between the base power input unit and the base power output unit, the first constant current power supply and the first switching member constitute the first constant current series connection line, the second constant current power supply and the second switching member constitute the second constant current series connection line, and the surface light emission module includes a first surface light emission module and a second surface light emission module.

The first surface light emission module includes a first switching means switching the first switching member from an on state to an off state and allowing an electric current of the first constant current series connection line to flow in the surface light emission panel by releasing the power passing means in a state where the first surface light emission module is installed in the scheduled light emission region.

The second surface light emission module includes a second switching means switching the second switching member from an on state to an off state by approaching the second switching member and allowing an electric current of the second constant current series connection line to flow in the surface light emission panel by releasing the power passing means in a state where the second surface light emission module is installed in the scheduled light emission region.

According to a surface light emission module based on the present invention, the surface light emission module includes a first surface light emission module emitting light by being installed in a scheduled light emission region of a base panel being partitioned into two or more scheduled light emission regions, the first surface light emission module includes: a first light emission line, in a state where the first surface light emission module is installed in the scheduled light emission region, connected to a first constant current series connection line constituted of a first constant current power supply, a first base power input unit of the base panel, and a first base power output unit of the base panel and supplying power to the first surface light emission module; and a first connection line, in a state where the first surface light emission module is installed in the scheduled light emission region, connected to a second constant current series connection line constituted of a second constant current power supply, a second base power input unit of the base panel, and a second base power output unit of the base panel and allowing power from an adjacent scheduled light emission region to pass through by directly connecting the second base power input unit to the second base power output unit.

According to another aspect, the surface light emission module includes a second surface light emission module, and the second surface light emission module includes: a second connection line, in a state where the second surface light emission module is installed in the scheduled light emission region, connected to the first constant current series connection line and allowing the power from the adjacent scheduled light emission region to pass through by directly connecting the first base power input unit to the first base power output unit; and a second light emission line, in a state where it is installed in the scheduled light emission region, connected to the second constant current series connection line and supplying the power to the second light emission module.

Advantageous Effects of Invention

By using the illumination device and the surface light emission module, it is possible to provide the illumination device capable of making the selected region thereof to emit light by the surface light emission panels.

DESCRIPTION OF EMBODIMENTS

Figure 1:
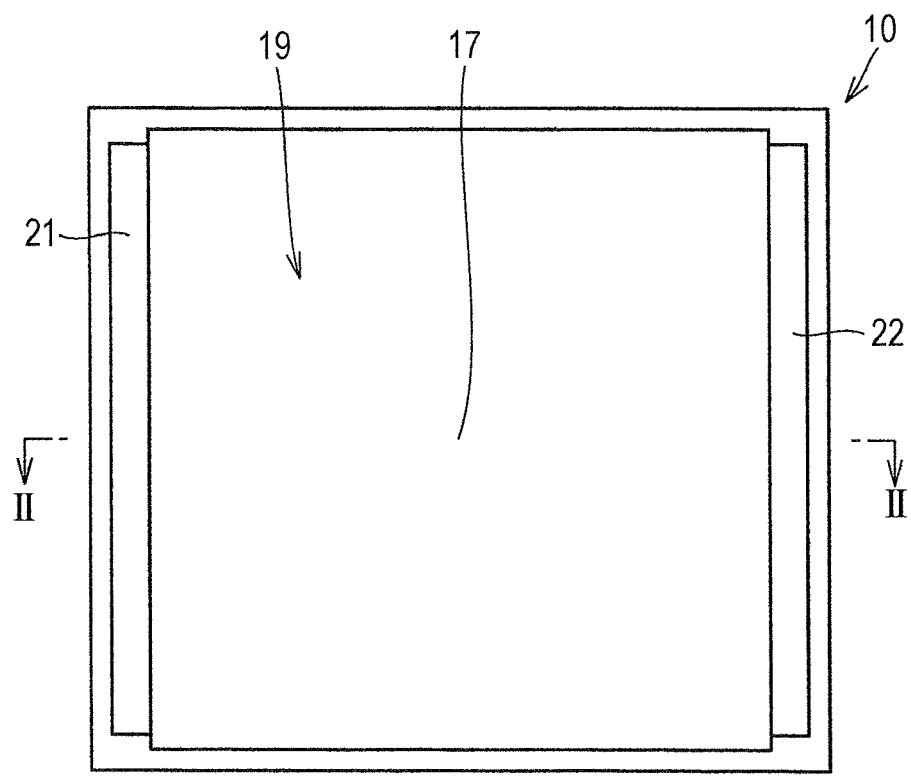
FIG. 1 is a plan view illustrating a basic configuration of a surface light emission panel according to a first embodiment.

Hereinafter, a description is given on an illumination device and a surface light emission module according to each embodiment of the present invention with reference to the drawings. In the embodiments described below, in a case where reference is made to the number, quantity, and the like, unless otherwise indicated, a scope of the present invention is not to be limited to the number, the quantity, and the like. The same components or equivalent components are denoted by the same reference numeral, and a duplicated description therefor may not be repeated. It has been planned from the beginning to use a configuration of each of the embodiments in combination with each other as appropriate.

(First embodiment: surface light emission panel 10)

Figure 2:
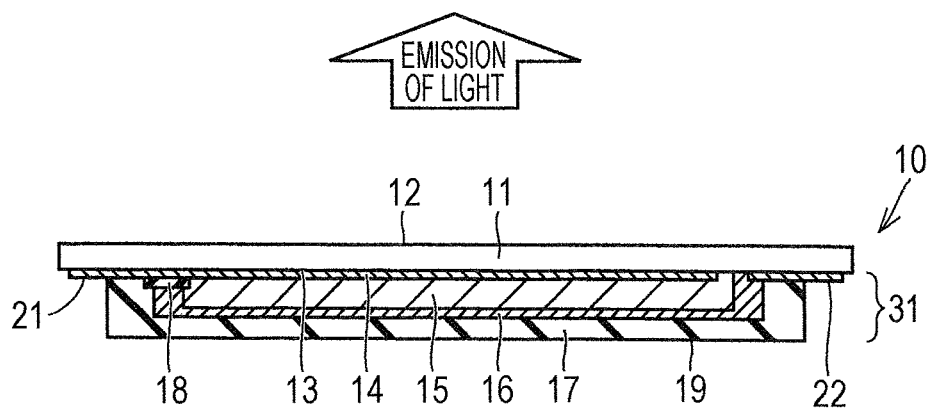
FIG. 2 is a sectional view cut along line II-II and viewed from a direction of arrows in FIG. 1.

With reference to FIGS. 1 and 2, a description is given on a basic configuration of a surface light emission panel 10 according to this embodiment. FIG. 1 is a front view illustrating the surface light emission panel 10, and in FIG. 1, a state is illustrated in which the surface light emission panel 10 is viewed from a side of a back face 19 of the surface light emission panel 10. FIG. 2 is a sectional view cut along line II-II and viewed from a direction of arrows in FIG. 1.

The surface light emission panel 10 according to this embodiment includes a transparent substrate 11 (cover layer), a positive pole (anode) 14, an organic layer 15, a negative pole (cathode) 16, a sealing member 17, and an insulation layer 18. The positive pole 14, the organic layer 15, the negative pole 16, and the sealing member 17 constitute a surface light emission unit 31.

The transparent substrate 11 forms a light emission surface 12 (front face) of the surface light emission panel 10. The positive pole 14, the organic layer 15, and the negative pole 16 are laminated in order on a back face 13 of the transparent substrate 11. The sealing member 17 forms the back face 19 of the surface light emission panel 10.

As a member constituting the transparent substrate 11, a transparent member is used. As a material, for example, a light transmitting film substrate such as polyethylene terephthalate (PET) and polycarbonate (PC) is used. It is also possible to use a variety of glass substrates as the transparent substrate 11.

As the light transmitting film substrate, it is also possible to use polyimide, polyethylene naphthalate (PEN), polystyrene (PS), polyether sulfone (PES), polypropylene (PP), and the like.

The positive pole 14 is a conductive film having transparency. To form the positive pole 14, indium tin oxide (ITO) or the like is deposited on the transparent substrate 11 by a sputtering method and the like. Another material used as the positive pole 14 may be polyethylene dioxythiophene (PEDOT).

The organic layer 15 (light emission portion) is capable of generating light (visible light) by being supplied with power. The organic layer 15 may be constituted of a single light emission layer or a lamination such as of a positive hole transport layer, a light emission layer, a positive hole blocking layer, and an electron transport layer in order.

The negative pole 16 is aluminum (Al), for example. The negative pole 16 is formed so as to cover the organic layer 15 by a vacuum deposition method or the like. To pattern the negative pole 16 in a predetermined shape, a mask may be used during vacuum deposition. As another material for the negative pole 16, lithium fluoride (LiF), a lamination of Al and Ca, a lamination of Al and LiF, a lamination of Al and Ba, or the like may be used.

Such that the negative pole 16 and the positive pole 14 do not cause a short circuit, the insulation layer 18 is provided between the negative pole 16 and the positive pole 14. For example, after $SiO_2$ or the like is deposited by using the sputtering method, the insulation layer 18 is formed into a desired pattern so as to cover a part where the positive pole 14 and the negative pole 16 are to be mutually insulated by using a photolithography method or the like.

The sealing member 17 is constituted of a resin, a glass substrate, or the like having an insulation property. The sealing member 17 is formed to protect the organic layer 15 from moisture and the like. The sealing member 17 seals substantially whole of the positive pole 14, the organic layer 15, and the negative pole 16 (members provided inside the surface light emission panel 10) on the transparent substrate 11. Apart of the positive pole 14 is exposed from the sealing member 17 for a purpose of electric connection.

As the sealing member 17, a member having a gas barrier property is used in which a plurality of layers of an inorganic thin film of $SiO_2$, $AL_2O_3$, SiNx, or the like and an acrylic resin thin film or the like having flexibility are laminated on a film of PET, PEN, PS, PES, polyimide, or the like. An electrode unit 21 and an electrode unit 22 may be further laminated with gold, silver, copper, and the like.

The electrode unit 21 (positive pole) is constituted of a part of the positive pole 14 exposed from the sealing member 17 (left side in FIG. 2). The electrode unit 21 and the positive pole 14 are made of the same material. The electrode unit 21 is positioned on an outer periphery of one of side faces of the surface light emission panel 10. The electrode unit 22 (negative pole) is constituted of a part of the negative pole 16 exposed from the sealing member 17 (right side in FIG. 2). The electrode unit 22 and the negative pole 16 are made of the same material. The electrode unit 22 is positioned on an outer periphery of the other of the side faces of the surface light emission panel 10.

The electrode unit 21 and the electrode unit 22 are positioned opposite to each other interposing the organic layer 15. On the electrode unit 21 and the electrode unit 22, a wiring pattern (not illustrated) is mounted by using soldering (silver paste) or the like.

The organic layer 15 of the surface light emission panel 10 configured as above is supplied with power from an external power supply device through the electrode units 21 and 22, the positive pole 14, and the negative pole 16. Light generated in the organic layer 15 is extracted to the outside from the light emission surface 12 (front face) through the positive pole 14 and the transparent substrate 11.

(Illumination Device 100)

Figure 3:
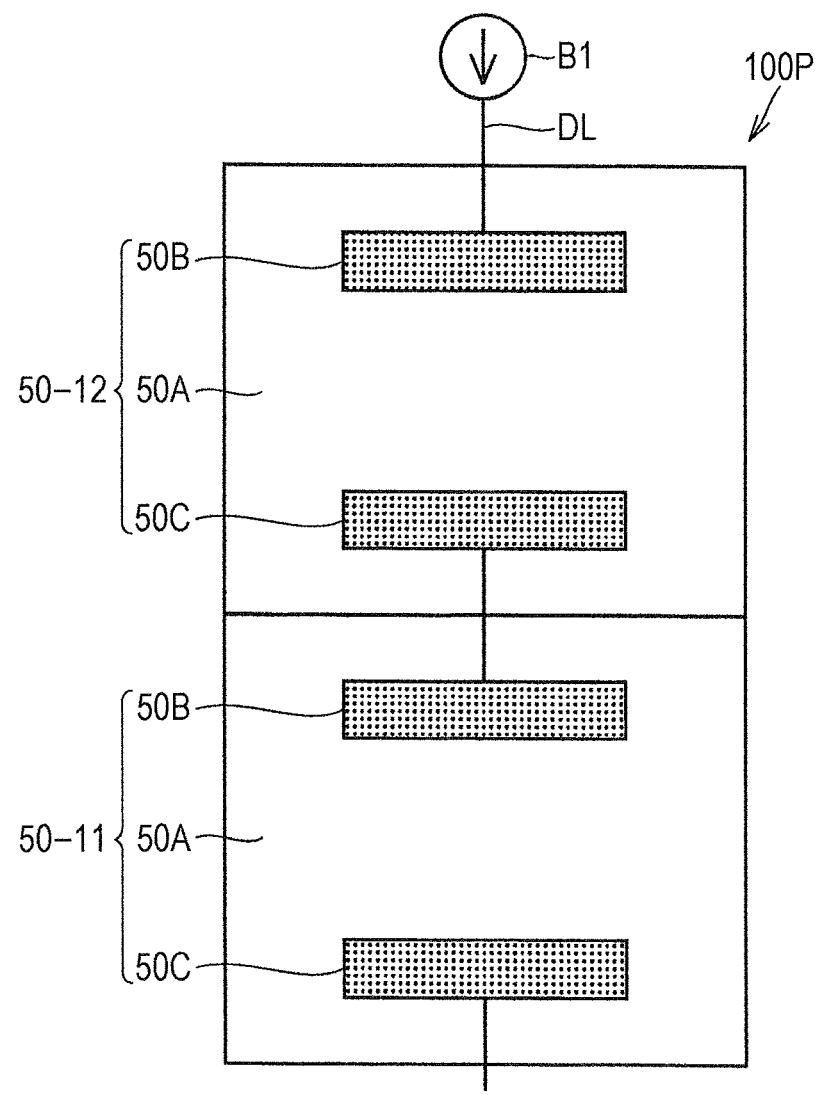
FIG. 3 is a plan view illustrating a panel base used in an illumination device according to the first embodiment.
Figure 4:
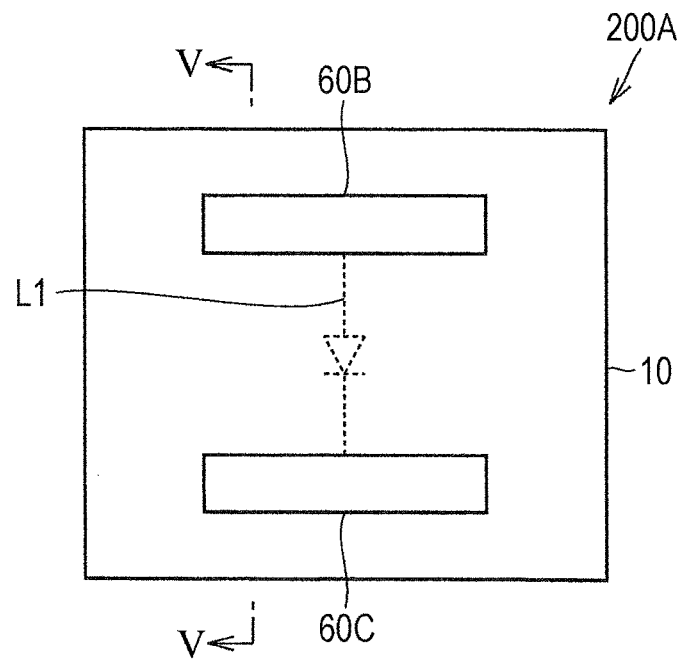
FIG. 4 is a plan view illustrating a surface light emission module used in the illumination device according to the first embodiment.
Figure 5:
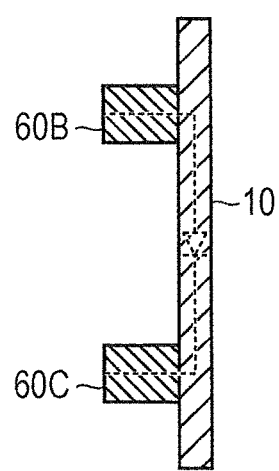
FIG. 5 is a sectional view cut along line V-V and viewed from a direction of arrows in FIG. 4.
Figure 6:
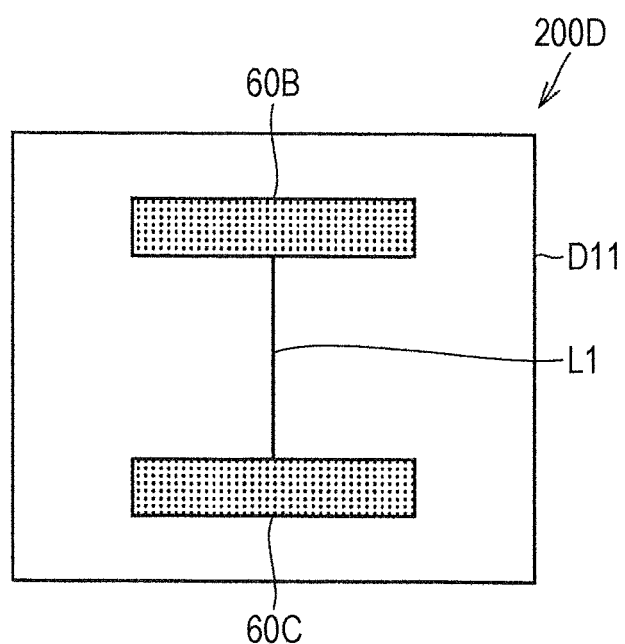
FIG. 6 is a plan view illustrating a connection panel used in the illumination device according to the first embodiment.
Figure 7:
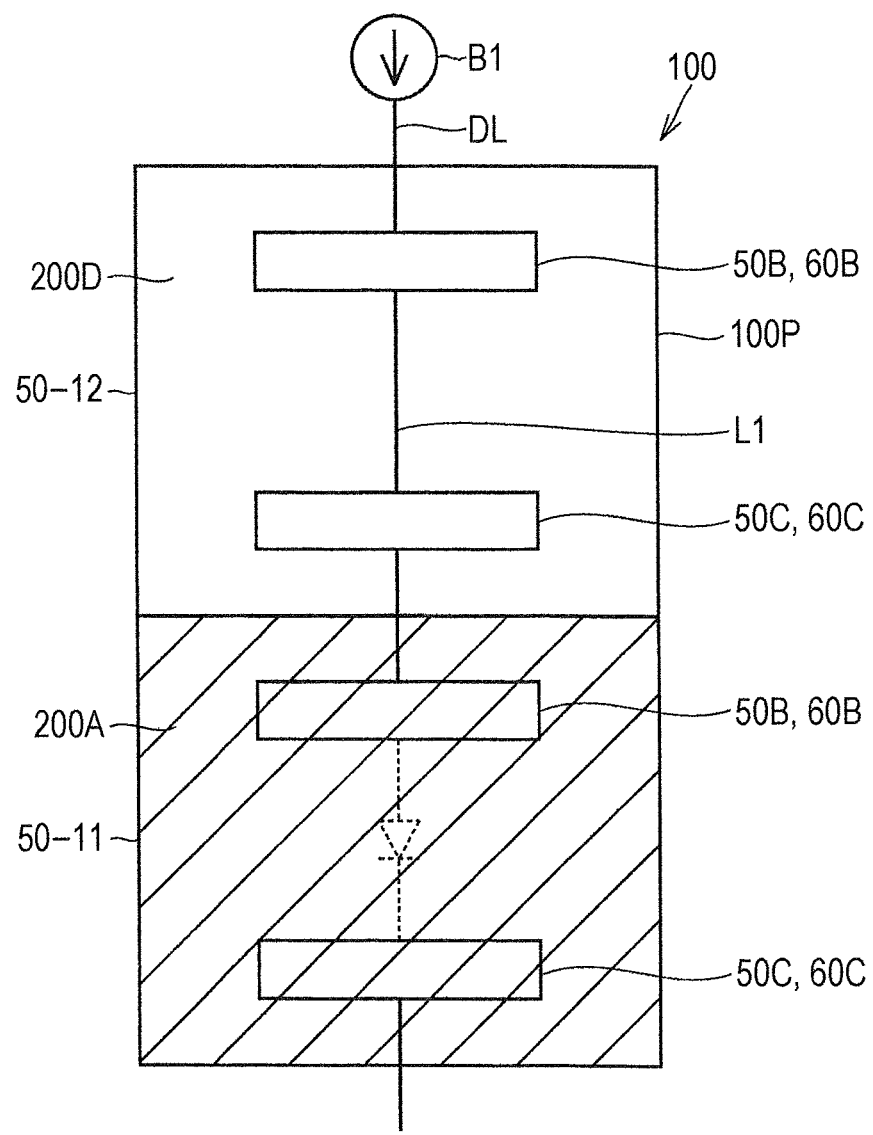
FIG. 7 is a plan view illustrating the illumination device according to the first embodiment.
Figure 8:
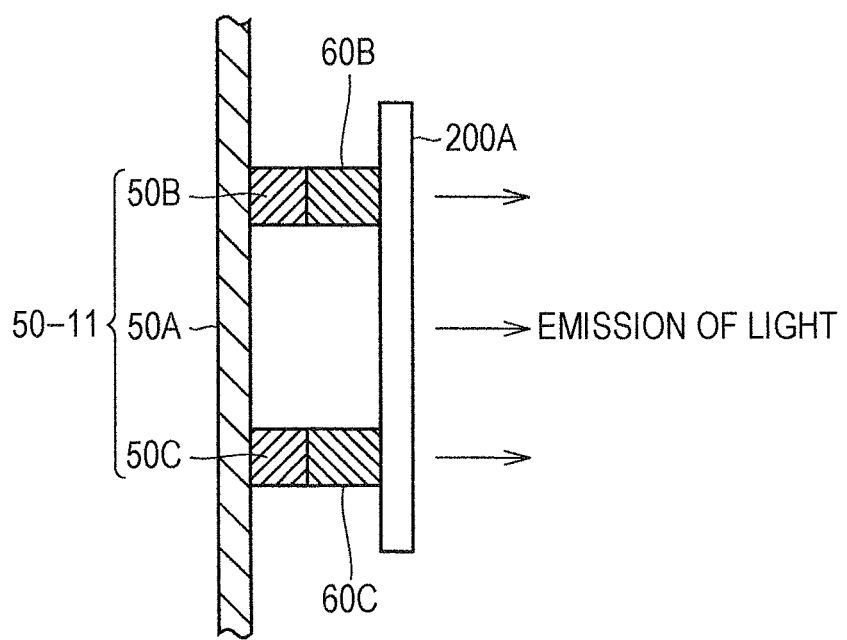
FIG. 8 is a sectional view illustrating a state in which the surface light emission module is connected to the panel base of the illumination device according to the first embodiment.

Hereinafter, a description is given on an illumination device 100 according to this embodiment with reference to FIGS. 3 to 8. FIG. 3 is a plan view illustrating a panel base 100P used in the illumination device 100, FIG. 4 is a plan view illustrating a surface light emission module 200A used in the illumination device 100, FIG. 5 is a sectional view cut along line V-V and viewed from a direction of arrows in FIG. 4, FIG. 6 is a plan view illustrating a connection panel 200D used in the illumination device 100, FIG. 7 is a plan view illustrating the illumination device 100, and FIG. 8 is a sectional view illustrating a state in which the surface light emission module 200A is connected to the panel base 100P of the illumination device 100.

(Panel Base 100P)

The panel base 100P is partitioned into two scheduled light emission regions 50-11 and 50-12. In this embodiment, a partitioned shape of each of the scheduled light emission regions 50-11 and 50-12 is a square; however, the partitioned shape is not limited to the square.

In the scheduled light emission region 50-11, an input connecting connector 50B as a base power input unit and an output connecting connector 50C as a base power output unit are disposed with a predetermined gap therebetween. In the same way as in the scheduled light emission region 50-11, in the scheduled light emission region 50-12 as well, an input connecting connector 50B as the base power input unit and an output connecting connector 50C as the base power output unit are disposed with a predetermined gap therebetween.

A first power supply B1 is connected to the input connecting connector 50B of the scheduled light emission region 50-12. The output connecting connector 50C of the scheduled light emission region 50-12 is electrically connected to the input connecting connector 50B of the scheduled light emission region 50-11.

By the output connecting connector 50C of the scheduled light emission region 50-12 being connected to the input connecting connector 50B of the scheduled light emission region 50-11, which is adjacent to the scheduled light emission region 50-12 in this way, a series connection line DL is constituted of the first power supply B1, the scheduled light emission region 50-12, and the scheduled light emission region 50-11.

(Surface Light Emission Module 200A)

Next, a description is given on the surface light emission module 200A according to this embodiment with reference to FIGS. 4 and 5. The surface light emission panel 10 illustrated in FIG. 1 is used as the surface light emission module 200A. The surface light emission module 200A includes a wiring connector 60B as a panel power input unit to be connected to the positive pole 14 and a wiring connector 60C as a panel power output unit to be connected to the negative pole 16. As illustrated in FIG. 5, the wiring connector 60B and the wiring connector 60C are provided so as to protrude to a surface opposite to the light emission surface of the surface light emission panel 10.

(Connection Panel 200D)

Next, a description is given on the connection panel 200D as a power passing means according to this embodiment with reference to FIG. 6. As the connection panel 200D, a panel D11 having an external shape similar to that of the surface light emission panel 10 is used. The panel D11 constitutes a non-emission dummy panel having the same shape as the above-described surface light emission module 200A. In the same way as the surface light emission module 200A, the panel D11 is provided with a wiring connector 60B and a wiring connector 60C. Furthermore, the wiring connector 60B and the wiring connector 60C are directly connected to each other by a wiring line L1.

(Illumination Device 100)

Next, a description is given on the illumination device 100 provided with the panel base 100P, the surface light emission module 200A, and the connection panel 200D, which are described above, with reference to FIGS. 7 and 8. In this embodiment, in the panel base 100P, the scheduled light emission region 50-11 is selected as a light emission region while the scheduled light emission region 50-12 is unselected as the light emission region (i.e., light is not emitted). Note that in the drawings herein, the light emission region is indicated as a shaded region.

In the scheduled light emission region 50-12 of the panel base 100P, the connection panel 200D is installed.

Accordingly, the input connecting connector 50B of the scheduled light emission region 50-12 is directly connected to the output connecting connector 50C thereof, whereby it is in a state where power from the first power supply B1 can be supplied to the scheduled light emission region 50-11.

In the scheduled light emission region 50-11 of the panel base 100P, the surface light emission module 200A is installed. Accordingly, as illustrated FIG. 8, the input connecting connector 50B of the scheduled light emission region 50-11 is connected to the wiring connector 60B of the surface light emission module 200A, and the output connecting connector 50C of the scheduled light emission region 50-11 is connected to the wiring connector 60C of the surface light emission module 200A, whereby it is in a state where power is supplied to the surface light emission module 200A. In this way, in the illumination device 100, it is possible to easily make the selected scheduled light emission region 50-11 to emit light by the surface light emission module 200A provided with the surface light emission panel.

In this embodiment, a description has been given on a case where the panel base 100P is provided with the two scheduled light emission regions 50-11 and 50-12 and the one series connection line DL as a minimum unit; however, it is also possible to use a configuration in which two or more scheduled light emission regions are provided or two or more series connection lines DL are disposed in parallel. In a second embodiment and a third embodiment described below, a specific configuration of an illumination device provided with scheduled light emission regions of five rows by four columns is described.

(Second embodiment: illumination device 200)

Figure 9:
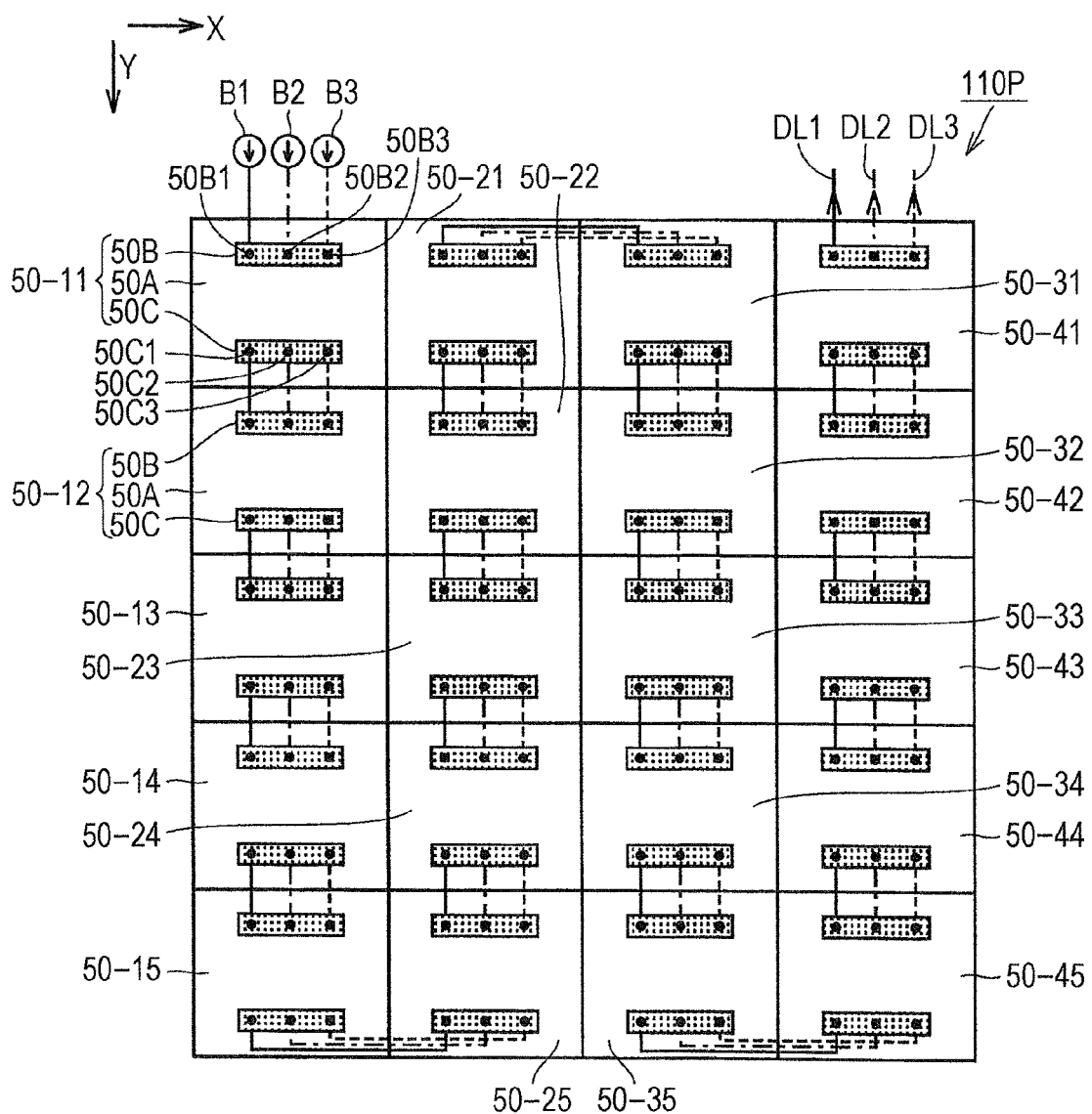
FIG. 9 is a plan view illustrating a panel base used in an illumination device according to a second embodiment.
Figure 10:
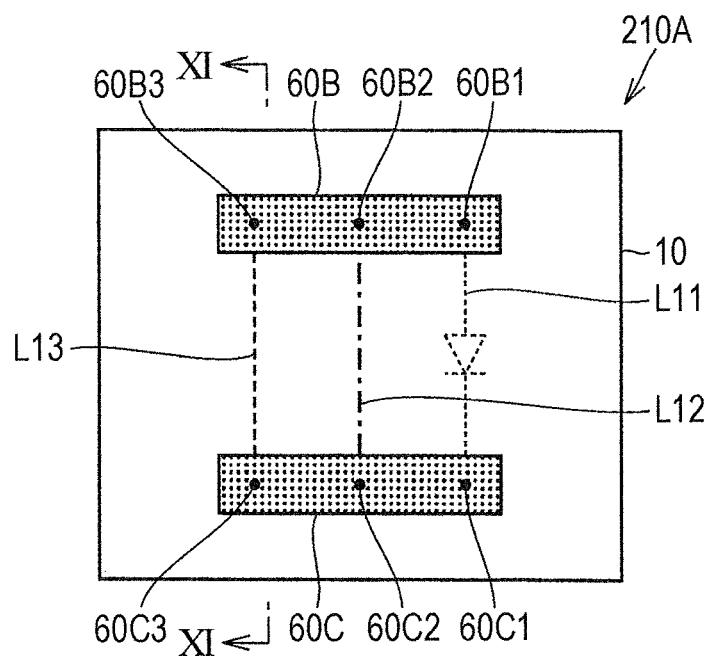
FIG. 10 is a plan view illustrating a first surface light emission module used in the illumination device according to the second embodiment.
Figure 11:
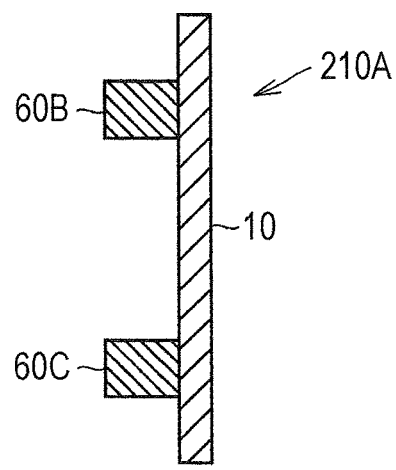
FIG. 11 is a sectional view cut along line XI-XI and viewed from a direction of arrows in FIG. 10.
Figure 12:
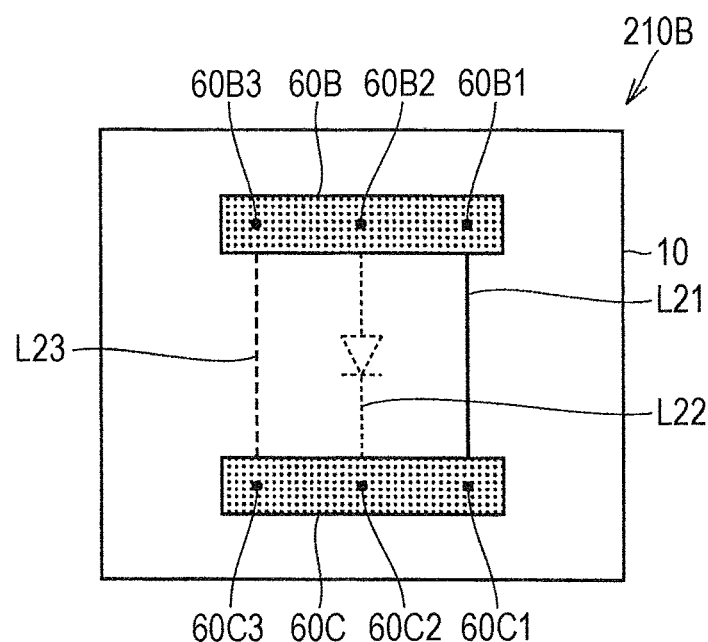
FIG. 12 is a plan view illustrating a second surface light emission module used in the illumination device according to the second embodiment.
Figure 13:
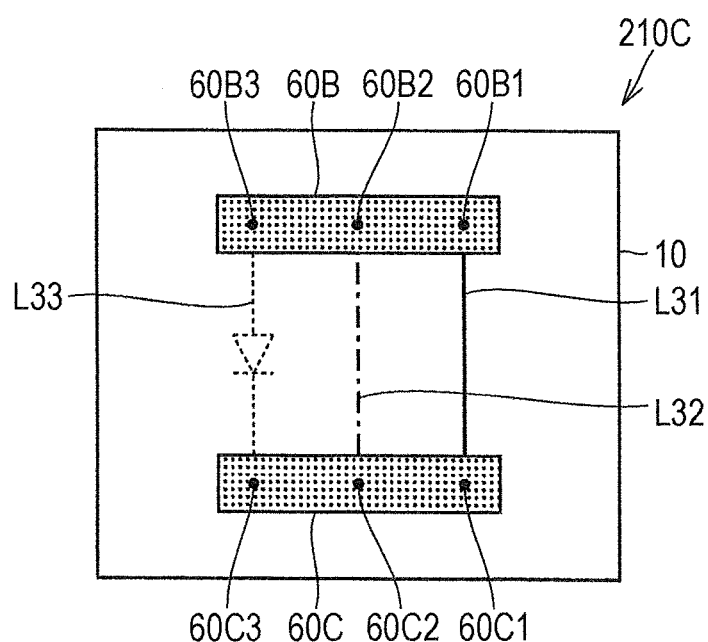
FIG. 13 is a plan view illustrating a third surface light emission module used in the illumination device according to the second embodiment.
Figure 14:
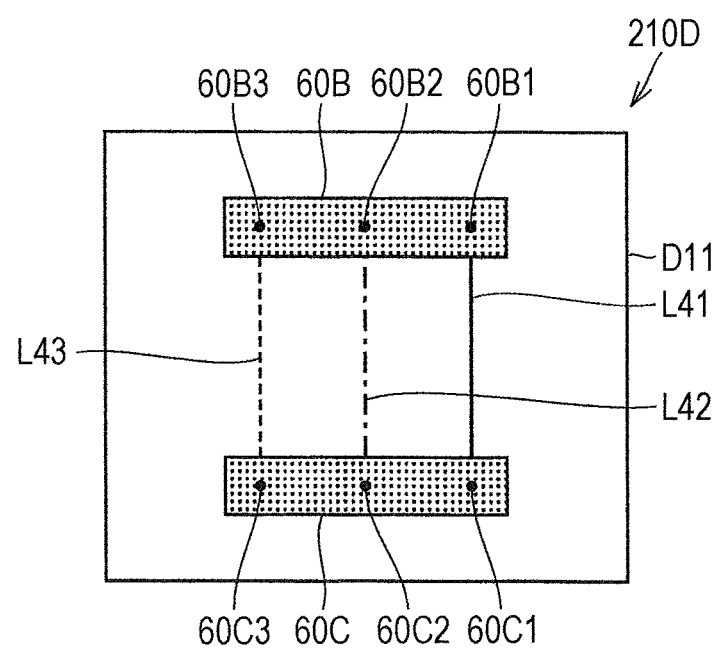
FIG. 14 is a plan view illustrating a connection panel used in the illumination device according to the second embodiment.
Figure 15:
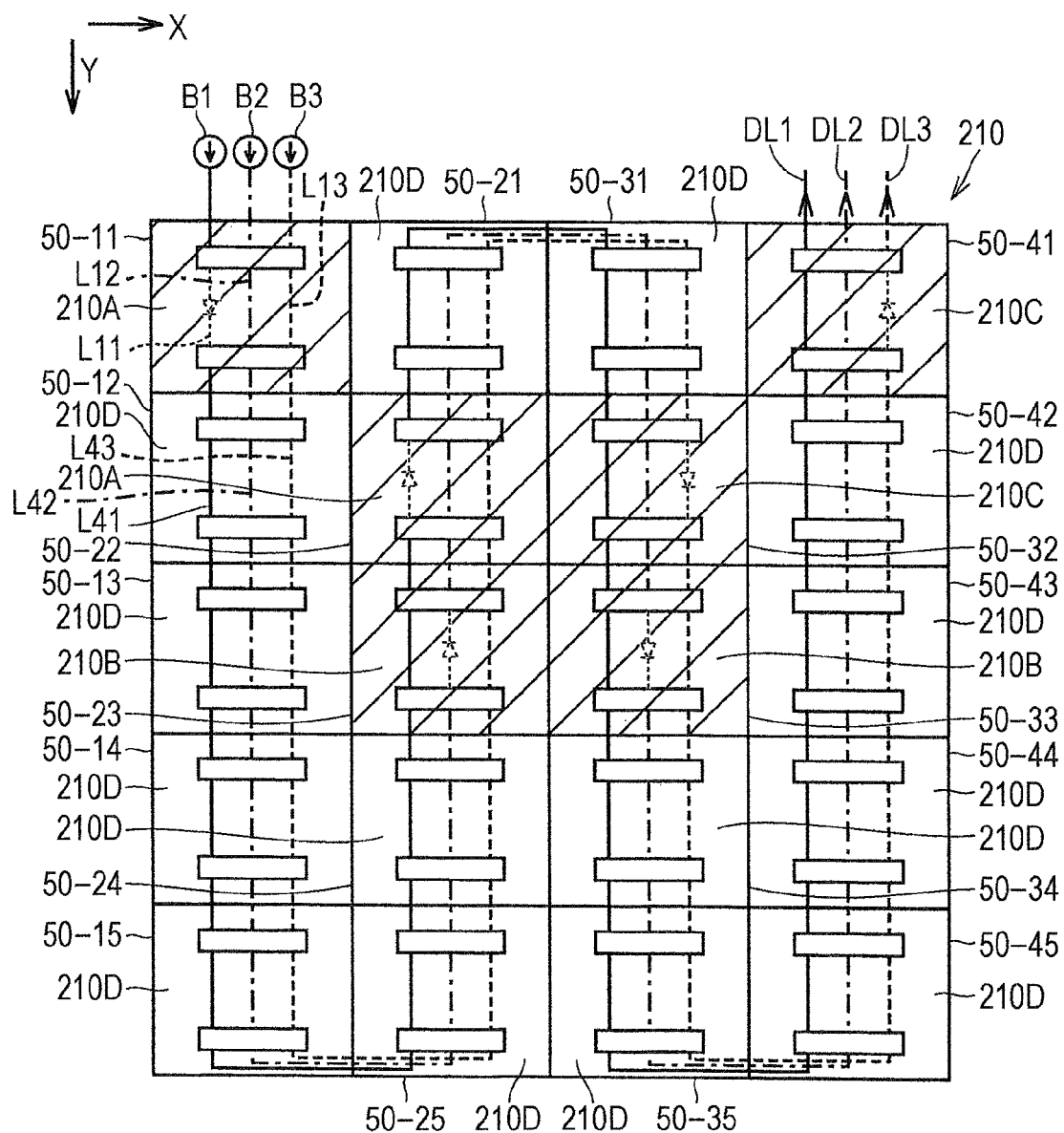
FIG. 15 is a plan view illustrating the illumination device according to the second embodiment.
Figure 16:
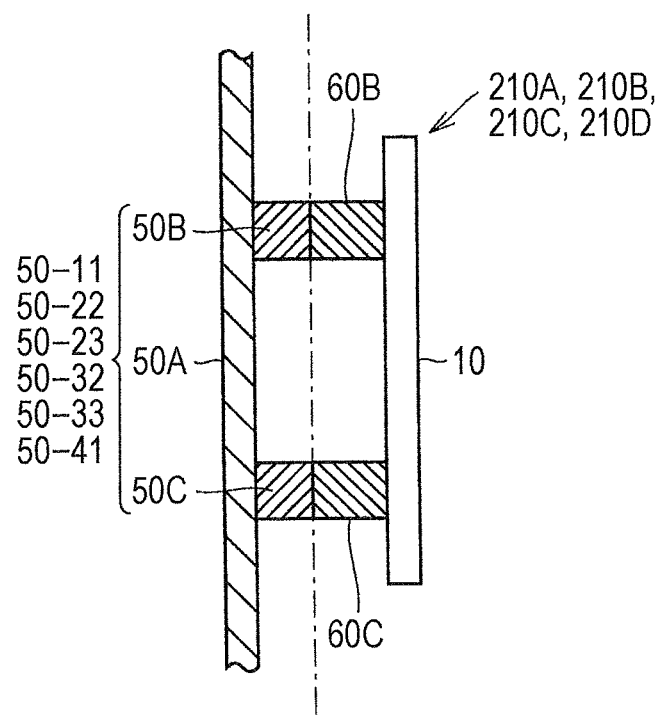
FIG. 16 is a sectional view illustrating a state in which the first surface light emission module is connected to the panel base of the illumination device according to the second embodiment.

Next, a description is given on an illumination device 200 according to this embodiment with reference to FIGS. 9 to 16. FIG. 9 is a plan view illustrating a panel base 110P used in the illumination device 200, FIG. 10 is a plan view illustrating a first surface light emission module 210A used in the illumination device 200, FIG. 11 is a sectional view cut along line XI-XI and viewed from a direction of arrows in FIG. 10, FIGS. 12 and 13 are plan views illustrating a second surface light emission module 210B and a third surface light emission module 210C used in the illumination device 200, FIG. 14 is a plan view illustrating a connection panel 210D used in the illumination device 200, FIG. 15 is a plan view illustrating the illumination device 200, and FIG. 16 is a sectional view illustrating a state in which the first surface light emission module 210A is connected to the panel base 110P.

(Panel base 110P)

The panel base 110P is partitioned into scheduled light emission regions 50-11 to 50-15, 50-21 to 50-25, 50-31 to 50-35, and 50-41 to 50-45 of five rows by four columns (in the drawing, Y direction is a row direction, and X direction is a column direction). Thus, the panel base 110P has twenty scheduled light emission regions. A partitioned shape of each of the scheduled light emission regions is a square; however, the partitioned shape is not limited to the square.

In the scheduled light emission region 50-11, an input connecting connector 50B as a base power input unit and an output connecting connector 50C as a base power output unit are disposed with a predetermined gap therebetween. In the same way as in the scheduled light emission region 50-11, in the scheduled light emission region 50-12 as well, an input connecting connector 50B as a base power input unit and an output connecting connector 50C as a base power output unit are disposed with a predetermined gap therebetween. The input connecting connector 50B has a first contact point 50B1, a second contact point 50B2, and a third contact point 50B3. The output connecting connector 50C has a first contact point 50C1, a second contact point 50C2, and a third contact point 50C3.

In the input connecting connector 50B of the scheduled light emission region 50-11, the first contact point 50B1 is connected to the first power supply B1, the second contact point 50B2 is connected to a second power supply B2, and the third contact point 50B3 is connected to a third power supply B3. Between the output connecting connector 50C of the scheduled light emission region 50-11 and the input connecting connector 50B of the scheduled light emission region 50-12, the first contact point 50C1 is electrically connected to the first contact point 50B1, the second contact point 50C2 is electrically connected to the second contact point 50B2, and the third contact point 50C3 is electrically connected to the third contact point 50B3. A constant current power supply is used as each of the first power supply B1, the second power supply B2, and the third power supply B3.

Each of the scheduled light emission regions 50-13 to 50-45 is also provided with an input connecting connector 50B and an output connecting connector 50C having the same configuration as those of the scheduled light emission region 50-11. The first contact point 50C1 of the adjacent scheduled light emission region is electrically connected to the first contact point 50B1, the second contact point 50C2 thereof is electrically connected to the second contact point 50B2, and the third contact point 50C3 thereof is electrically connected to the third contact point 50B3.

As a result, on the panel base 110P, three constant current series connection lines, which are a first constant current series connection line DL1 connected to the first power supply B1, a second constant current series connection line DL2 connected to the second power supply B2, and a third constant current series connection line DL3 connected to the third power supply B3, are disposed in parallel to each other.

Note that in this embodiment, a selected region refers to a region that is made to emit light by the surface light emission panel, and a description is given on a case where a maximum of two surface light emission modules are connected to each of the constant current series connection lines. The number of the surface light emission modules to be connected to each of the constant current series connection lines is changed as appropriate according to a specification requested of the illumination device. A high voltage becomes necessary as the number of the surface light emission modules to be connected is increased, whereby a specification of a constant current power supply is also changed as appropriate according to the number of the surface light emission modules to be connected.

(First to Third Surface Light Emission Modules 210A, 210B, and 210C)

Next, a description is given on the first to third surface light emission modules 210A, 210B, and 210C according to this embodiment with reference to FIGS. 10 to 14. The first surface light emission module 210A is specified to be connected to the first constant current series connection line DL1. The second surface light emission module 210B is specified to be connected to the second constant current series connection line DL2, and the third surface light emission module 210C is specified to be connected to the third constant current series connection line DL3.

(First Surface Light Emission Module 210A)

With reference to FIGS. 10 and 11, the surface light emission panel 10 illustrated in FIG. 1 is used as the first surface light emission module 210A, and a wiring connector 60B as a panel power input unit and a wiring connector 60C as a panel power output unit are provided thereto so as to protrude to a surface opposite to a light emission surface of the surface light emission panel 10.

The wiring connector 60B has a first contact point 60B1, a second contact point 60B2, and a third contact point 60B3. The wiring connector 60C has a first contact point 60C1, a second contact point 60C2, and a third contact point 60C3.

The first contact point 60B1 is connected to the positive pole 14 of the surface light emission panel 10, and the first contact point 60C1 is connected to the negative pole 16 of the surface light emission panel 10, constituting a first light emission line L11 that supplies power to the surface light emission panel 10. The second contact point 60B2 is electrically connected directly to the second contact point 60C2 by an eleventh connection line L12 as a power passing means. The third contact point 60B3 is electrically connected directly to the third contact point 60C3 by a twelfth connection line L13 as a power passing means.

(Second Surface Light Emission Module 210B)

With reference to FIG. 12, the surface light emission panel 10 illustrated in FIG. 1 is used as the second surface light emission module 210B, and a wiring connector 60B as a panel power input unit and a wiring connector 60C as a panel power output unit are provided thereto so as to protrude to a surface opposite to a light emission surface of the surface light emission panel 10 (same as in FIG. 11).

The wiring connector 60B has a first contact point 60B1, a second contact point 60B2, and a third contact point 60B3. The wiring connector 60C has a first contact point 60C1, a second contact point 60C2, and a third contact point 60C3.

The first contact point 60B1 is electrically connected directly to the first contact point 60C1 by a twenty first connection line L21 as a power passing means. The second contact point 60B2 is connected to the positive pole 14 of the surface light emission panel 10, and the second contact point 60C2 is connected to the negative pole 16 of the surface light emission panel 10, constituting a second light emission line L22 that supplies power to the surface light emission panel 10. The third contact point 60B3 is electrically connected directly to the third contact point 60C3 by a twenty second connection line L23 as a power passing means.

(Third Surface Light Emission Module 210C)

With reference to FIG. 13, the surface light emission panel 10 illustrated in FIG. 1 is used as the third surface light emission module 210C, and a wiring connector 60B as a panel power input unit and a wiring connector 60C as a panel power output unit are provided thereto so as to protrude to a surface opposite to a light emission surface of the surface light emission panel 10 (same as in FIG. 11).

The wiring connector 60B has a first contact point 60B1, a second contact point 60B2, and a third contact point 60B3. The wiring connector 60C has a first contact point 60C1, a second contact point 60C2, and a third contact point 60C3.

The first contact point 60B1 is electrically connected directly to the first contact point 60C1 by a thirty first connection line L31 as a power passing means. The second contact point 60B2 is electrically connected directly to the second contact point 60C2 by a thirty second connection line L32 as a power passing means. The third contact point 60B3 is connected to the positive pole 14 of the surface light emission panel 10, and the third contact point 60C3 is connected to the negative pole 16 of the surface light emission panel 10, constituting a third light emission line L33 that supplies power to the surface light emission panel 10.

(Connection Panel 210D)

Next, with reference to FIG. 14, a description is given on the connection panel 210D as a power passing means according to this embodiment. As the connection panel 210D, a panel D10 having an external shape similar to that of the surface light emission panel 10 is used. The panel D10 constitutes a non-emission dummy panel having the same shape as a shape of the above-described surface light emission modules 210A to 210C. In the same way as the surface light emission module 200A, the panel D10 is provided with a wiring connector 60B and a wiring connector 60C.

The wiring connector 60B has a first contact point 60B1, a second contact point 60B2, and a third contact point 60B3. The wiring connector 60C has a first contact point 60C1, a second contact point 60C2, and a third contact point 60C3.

The first contact point 60B1 is electrically connected directly to the first contact point 60C1 by a first connection line L41. The second contact point 60B2 is electrically connected directly to the second contact point 60C2 by a second connection line L42. The third contact point 60B3 is electrically connected directly to the third contact point 60C3 by a third connection line L43.

(Illumination Device 200)

Next, with reference to FIGS. 15 and 16, there is described the illumination device 200 provided with the above-described panel base 110P, the first to third surface light emission modules 210A to 210C, and the connection panel 210D. In this embodiment, in the panel base 110P, six regions of the scheduled light emission regions 50-11, 50-22, 50-23, 50-32, 50-33, and 50-41 are selected as the light emission regions while any other region is unselected as the light emission region (i.e., light is not emitted).

As described above, such that a maximum of two surface light emission modules can be connected to each of the first constant current series connection line DL1 connected to the first power supply B1, the second constant current series connection line DL2 connected to the second power supply B2, and the third constant current series connection line DL3 connected to the third power supply B3, power supply capacity of the first power supply B1, the second power supply B2, and the third power supply B3 is designed.

The first surface light emission module 210A is installed in the scheduled light emission region 50-11 of the panel base 110P. Accordingly, in a region of the scheduled light emission region 50-11, the first contact point 50B1 of the input connecting connector 50B is connected to the first contact point 60B1 of the wiring connector 60C, and the first contact point 50C1 of the output connecting connector 50C is connected to the first contact point 60C1 of the wiring connector 60C. As a result, the first light emission line L11 that supplies power to the surface light emission panel 10 is formed.

Similarly, the second contact point 50B2 of the input connecting connector 50B is connected to the second contact point 60B2 of the wiring connector 60C, and the second contact point 50C2 of the output connecting connector 50C is connected to the second contact point 60C2 of the wiring connector 60C. Accordingly, the eleventh connection line L12 that passes power by directly connecting the second contact point 50B2 of the input connecting connector 50B to the second contact point 50C2 of the output connecting connector 50C is formed.

Furthermore, the third contact point 50B3 of the input connecting connector 50B is connected to the third contact point 60B3 of the wiring connector 60C, and the third contact point 50C3 of the output connecting connector 50C is connected to the third contact point 60C3 of the wiring connector 60C. Accordingly, the twelfth connection line L13 that passes power by directly connecting the third contact point 50B3 of the input connecting connector 50B to the third contact point 50C3 of the output connecting connector 50C is formed.

Accordingly, the power from the first power supply B1 causes the first surface light emission module 210A to emit light through the first light emission line L11. The power from the second power supply B2 can be supplied to the adjacent non-emission scheduled light emission region 50-12 through the eleventh connection line L12. The power from the third power supply B3 can be supplied to the adjacent non-emission scheduled light emission region 50-12 through the twelfth connection line L13.

Next, the connection panel 210D is installed in the non-emission scheduled light emission region 50-12. Accordingly, the first contact point 50B1 of the input connecting connector 50B is connected to the first contact point 60B1 of the wiring connector 60C, and the first contact point 50C1 of the output connecting connector 50C is connected to the first contact point 60C1 of the wiring connector 60C. Accordingly, the first connection line L41 that directly connects the first contact point 50B1 of the input connecting connector 50B to the first contact point 50C1 of the output connecting connector 50C is formed.

Similarly, the second contact point 50B2 of the input connecting connector 50B is connected to the second contact point 60B2 of the wiring connector 60C, and the second contact point 50C2 of the output connecting connector 50C is connected to the second contact point 60C2 of the wiring connector 60C. Accordingly, the second connection line L42 that directly connects the second contact point 50B2 of the input connecting connector 50B to the second contact point 50C2 of the output connecting connector 50C is formed.

Furthermore, the third contact point 50B3 of the input connecting connector 50B is connected to the third contact point 60B3 of the wiring connector 60C, and the third contact point 50C3 of the output connecting connector 50C is connected to the third contact point 60C3 of the wiring connector 60C. Accordingly, the third connection line L43 that directly connects the third contact point 50B3 of the input connecting connector 50B to the third contact point 50C3 of the output connecting connector 50C is formed.

Accordingly, each of the power from the first power supply B1, the second power supply B2, and the third power supply B3 supplied to the scheduled light emission region 50-11 passes through the scheduled light emission region 50-12 and can be supplied to the adjacent scheduled light emission region 50-13.

In the same way as the above, the first surface light emission module 210A is installed in the scheduled light emission region 50-22. The second surface light emission modules 210B is installed in each of the scheduled light emission regions 50-23 and 50-33, and the third surface light emission module 210C is installed in each of the scheduled light emission regions 50-32 and 50-41. Any other unselected scheduled light emission region is installed with the connection panel 210D.

By completing a connection state as described above, the first constant current series connection line DL1 connected to the first power supply B1, the second constant current series connection line DL2 connected to the second power supply B2, and the third constant current series connection line DL3 connected to the third power supply B3 are constituted, whereby the surface light emission panel is caused to emit light in a power supply line in the selected scheduled light emission region while the power is passed in an unselected power supply line in the selected scheduled light emission region as well as in the unselected scheduled light emission region.

Furthermore, provided that the number of the surface light emission modules is within the number thereof connectable to each of the constant current series connection lines, it is possible to cause the surface light emission module to emit light by installing the surface light emission module in an arbitrary position not limited to positions illustrated in FIG. 15 without changing a wiring structure.

Furthermore, by using a series connection line using a constant current power supply as a power supply, provided that the number of the surface light emission modules is within a range of the number thereof determined in advance, it is possible to make an electric current flowing in the series connection line (power supply line) constant regardless of the number thereof.

Furthermore, in a case where six surface light emission panels are provided to one series connection line, power supply wiring becomes thick; however, as described in this embodiment, it is possible to make each of the power supply wiring thin by dividing it into three series connection lines, whereby wiring handling may be made easy.

(Third embodiment: illumination device 300)

Next, a description is given on an illumination device 300 according to this embodiment with reference to FIGS. 17 to 23. In the above-described second embodiment, in the unselected scheduled light emission region, the connection panel 210D constituting the non-emission dummy panel is used for passing the electric current to the next scheduled light emission region. In this embodiment, an illumination device constituted without using the non-emission dummy panel is described.

Figure 17:
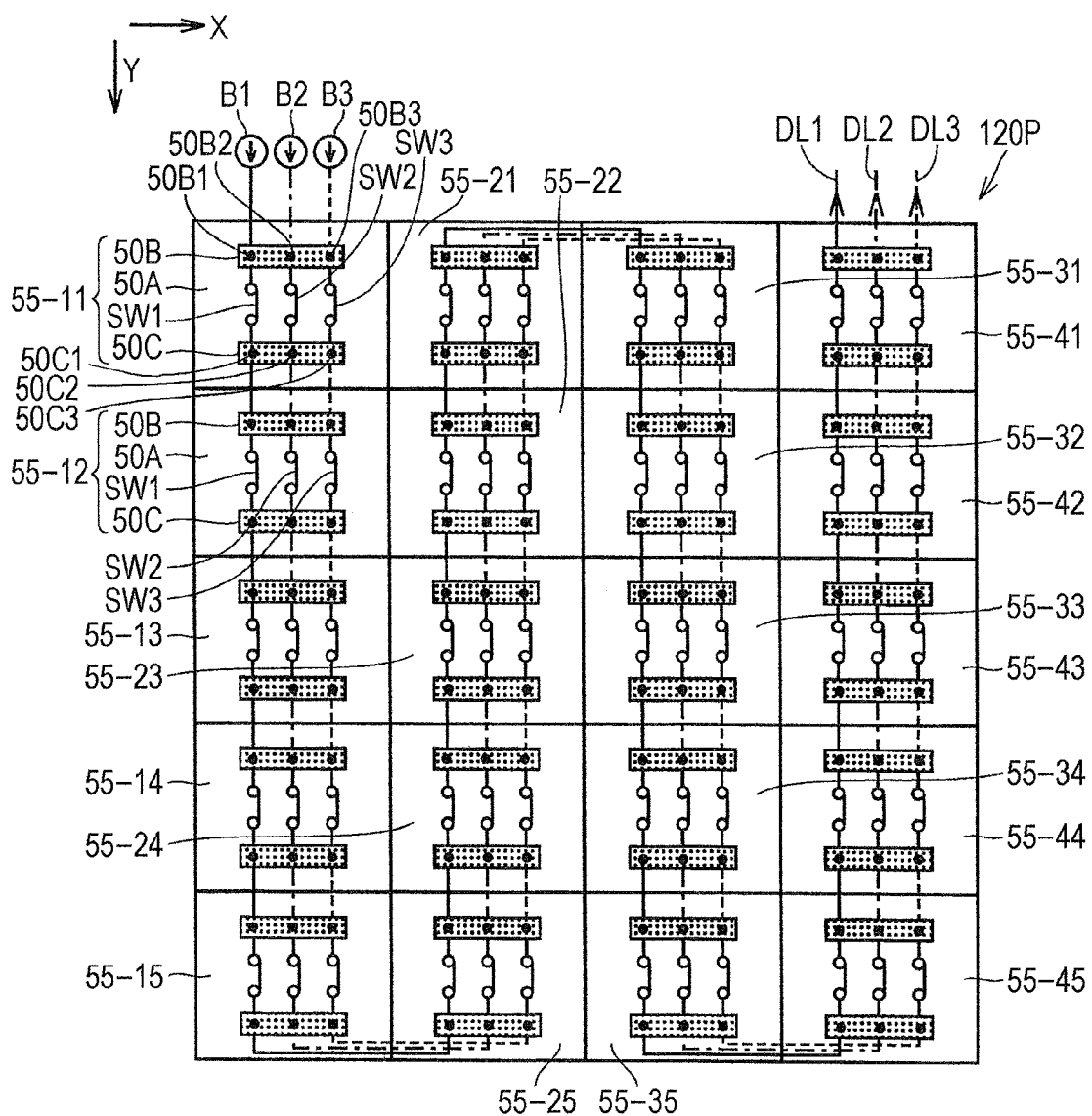
FIG. 17 is a plan view illustrating a panel base used in an illumination device according to a third embodiment.
Figure 18:
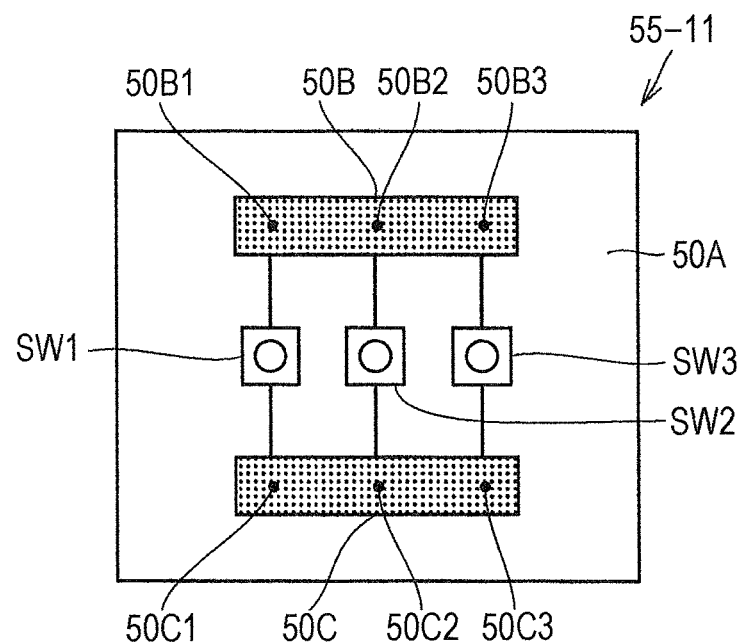
FIG. 18 is a plan view illustrating a configuration of a scheduled light emission region of the panel base used in the illumination device according to the third embodiment.
Figure 19:
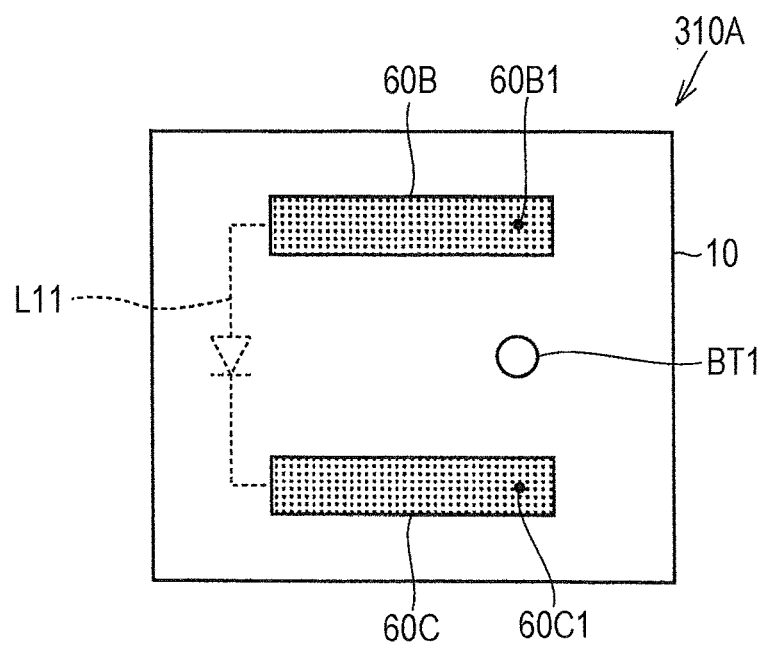
FIG. 19 is a plan view illustrating a first surface light emission module used in the illumination device according to the third embodiment.
Figure 20:
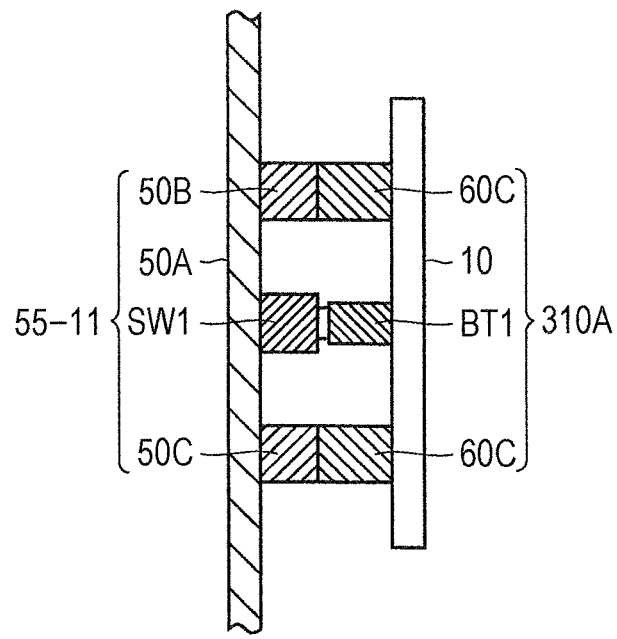
FIG. 20 is a sectional view illustrating a state in which the first surface light emission module is connected to the panel base of the illumination device according to the third embodiment.
Figure 21:
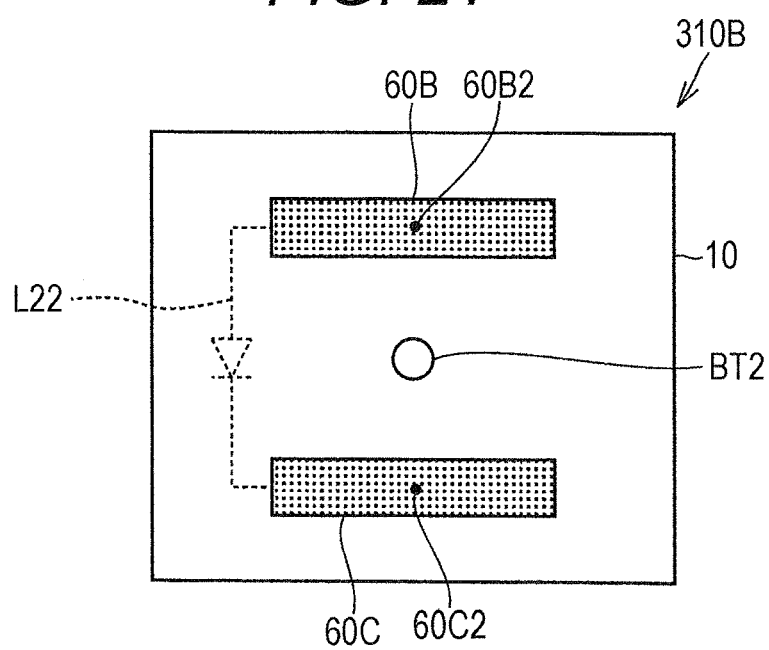
FIG. 21 is a plan view illustrating a second surface light emission module used in the illumination device according to the third embodiment.
Figure 22:
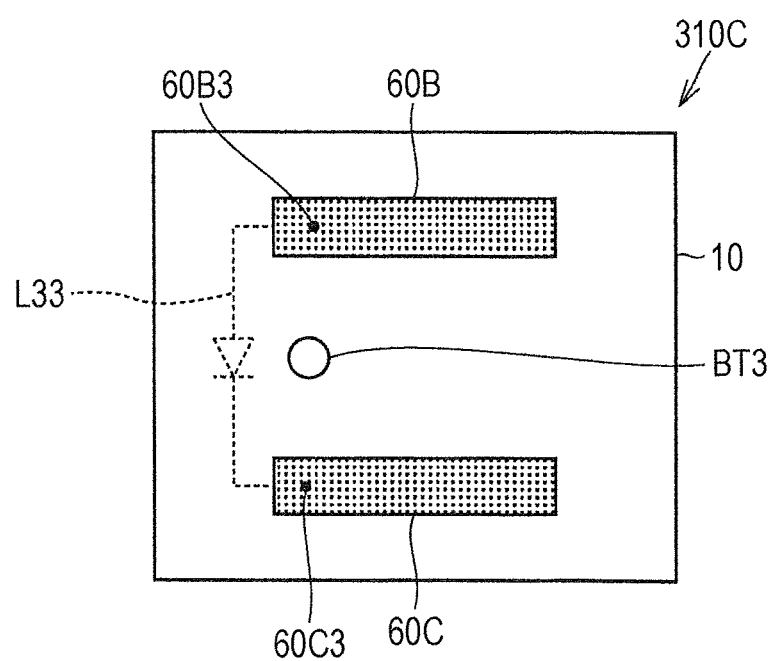
FIG. 22 is a plan view illustrating a third surface light emission module of the illumination device according to the third embodiment.
Figure 23:
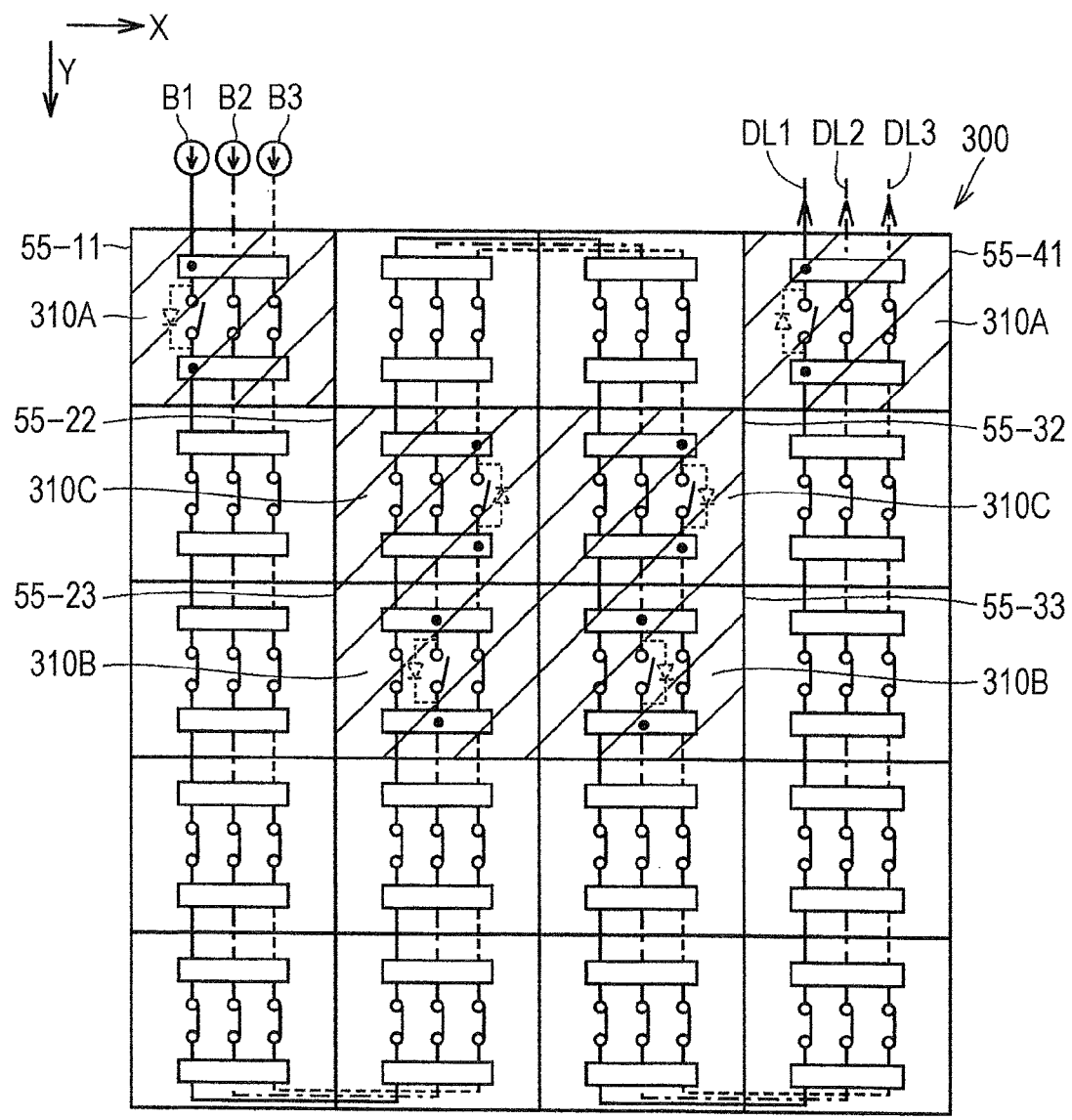
FIG. 23 is a plan view illustrating the illumination device according to the third embodiment.

FIG. 17 is a plan view illustrating a panel base 120P used in the illumination device 300, FIG. 18 is a plan view illustrating a configuration of a scheduled light emission region 55-11 of the panel base used in the illumination device 300, FIG. 19 is a plan view illustrating a first surface light emission module 310A used in the illumination device 300, FIG. 20 is a sectional view illustrating a state in which the first surface light emission module 310A is connected to the panel base 120P of the illumination device 300, FIGS. 21 and 22 are plan views illustrating second and third surface light emission modules 310B and 310C used in the illumination device 300, and FIG. 23 is a plan view illustrating the illumination device 300.

(Panel base 120P)

In FIG. 17, the panel base 120P is partitioned into scheduled light emission regions 55-11 to 55-15, 55-21 to 55-25, 55-31 to 55-35, and 55-41 to 55-45 of five rows by four columns (in the drawing, Y direction is a row direction, and X direction is a column direction). Thus, the panel base 120P has twenty scheduled light emission regions. A partitioned shape of each of the scheduled light emission regions is a square; however, the partitioned shape is not limited to the square.

With reference to FIGS. 17 and 18, in the scheduled light emission region 55-11, an input connecting connector 50B as a base power input unit and an output connecting connector 50C as a base power output unit are disposed with a predetermined gap therebetween. In the same way as in the scheduled light emission region 55-11, in the scheduled light emission region 55-12 as well, an input connecting connector 50B as a base power input unit and an output connecting connector 50C as a base power output unit are disposed with a predetermined gap therebetween. The input connecting connector 50B has a first contact point 50B1, a second contact point 50B2, and a third contact point 50B3. The output connecting connector 50C has a first contact point 50C1, a second contact point 50C2, and a third contact point 50C3.

Between the first contact point 50B1 and the first contact point 50C1, a first switching member SW1 as a power passing means is provided, and it is in an on state under a normal condition. Between the second contact point 50B2 and the second contact point 50C2, a second switching member SW2 as a power passing means is provided, and it is in an on state under the normal condition. Between the third contact point 50B3 and the third contact point 50C3, a third switching member SW3 as a power passing means is provided, and it is in an on state under the normal condition. A button switch illustrated in FIG. 18 is used for each of the first switching member SW1, the second switching member SW2, and the third switching member SW3.

In this embodiment, the same configuration as that of the scheduled light emission region 55-11 is used in all of the scheduled light emission regions. Between the adjacent scheduled light emission regions, the first contact point 50C1 is electrically connected to the first contact point 50B1, the second contact point 50C2 is electrically connected to the second contact point 50B2, and the third contact point 50C3 is electrically connected to the third contact point 50B3.

As a result, on the panel base 120P, three constant current series connection lines, which are the first constant current series connection line DL1 connected to the first power supply B1, the second constant current series connection line DL2 connected to the second power supply B2, and the third constant current series connection line DL3 connected to the third power supply B3, are disposed in parallel to each other.

Note that in this embodiment, a selected region refers to a region that is made to emit light by the surface light emission panel, and a description is given on a case where a maximum of two surface light emission modules are connected to each of the constant current series connection lines. The number of the surface light emission modules to be connected to each of the constant current series connection lines is changed as appropriate according to a specification requested of the illumination device. A high voltage becomes necessary as the number of the surface light emission modules to be connected is increased, whereby a specification of a constant current power supply is also changed as appropriate according to the number of the surface light emission modules to be connected.

(First to Third Surface Light Emission Modules 310A, 310B, and 310C)

Next, a description is given on the first to third surface light emission modules 310A, 310B, and 310C according to this embodiment with reference to FIGS. 19 to 22. The first surface light emission module 310A is specified to be connected to the first constant current series connection line DL1. The second surface light emission module 310B is specified to be connected to the second constant current series connection line DL2, and the third surface light emission module 310C is specified to be connected to the third constant current series connection line DL3.

(First Surface Light Emission Module 310A)

With reference to FIGS. 19 and 20, the surface light emission panel 10 illustrated in FIG. 1 is used as the first surface light emission module 310A, and a wiring connector 60B as a panel power input unit and a wiring connector 60C as the panel power output unit are provided thereto so as to protrude to a surface opposite to a light emission surface of the surface light emission panel 10.

The wiring connector 60B has a first contact point 60B1. The wiring connector 60C has a first contact point 60C1. The first contact point 60B1 is connected to the positive pole 14 of the surface light emission panel 10, and the first contact point 60C1 is connected to the negative pole 16 of the surface light emission panel 10, constituting a first light emission line L11 that supplies power to the surface light emission panel 10.

Furthermore, on the surface opposite to the light emission surface of the surface light emission panel 10, there is provided a protrusion BT1 as a first switching means. When the first surface light emission module 310A is installed in the scheduled light emission region, the protrusion BT1 abuts on the first switching member SW1 (see FIG. 20), switches the first switching member SW1 from the on state to an off state, and causes the electric current of the first constant current series connection line DL1 to flow in the surface light emission panel 10 by releasing the power passing means.

(Second Surface Light Emission Module 310B)

With reference to FIG. 21, the surface light emission panel 10 illustrated in FIG. 1 is used as the second surface light emission module 310B, and a wiring connector 60B as a panel power input unit and a wiring connector 60C as a panel power output unit are provided thereto so as to protrude to the surface opposite to the light emission surface of the surface light emission panel 10.

The wiring connector 60B has a second contact point 60B2. The wiring connector 60C has a second contact point 60C2. The second contact point 60B2 is connected to the positive pole 14 of the surface light emission panel 10, and the second contact point 60C2 is connected to the negative pole 16 of the surface light emission panel 10, constituting a second light emission line L22 that supplies power to the surface light emission panel 10.

Furthermore, on the surface opposite to the light emission surface of the surface light emission panel 10, there is provided a protrusion BT2 as a second switching means. When the second surface light emission module 310B is installed in the scheduled light emission region, the protrusion BT2 abuts on the second switching member SW2, switches the second switching member SW2 from the on state to the off state, and causes the electric current of the second constant current series connection line DL2 to flow in the surface light emission panel 10 by releasing the power passing means.

(Third Surface Light Emission Module 310C)

With reference to FIG. 22, the surface light emission panel 10 illustrated in FIG. 1 is used as the second surface light emission module 310C, and a wiring connector 60B as a panel power input unit and a wiring connector 60C as a panel power output unit are provided thereto so as to protrude to the surface opposite to the light emission surface of the surface light emission panel 10.

The wiring connector 60B has a third contact point 60B3. The wiring connector 60C has a third contact point 60C3. The third contact point 60B3 is connected to the positive pole 14 of the surface light emission panel 10, and the third contact point 60C3 is connected to the negative pole 16 of the surface light emission panel 10, constituting a third light emission line L33 that supplies power to the surface light emission panel 10.

Furthermore, on the surface opposite to the light emission surface of the surface light emission panel 10, there is provided a protrusion BT3 as a third switching means. When the third surface light emission module 310C is installed in the scheduled light emission region, the protrusion BT3 abuts on the third switching member SW3, switches the third switching member SW3 from the on state to the off state, and causes the electric current of the third constant current series connection line DL3 to flow in the surface light emission panel 10 by releasing the power passing means.

(Illumination Device 300)

Next, with reference to FIG. 23, there is described the illumination device 300 provided with the above-described panel base 120P and the first to third surface light emission modules 310A to 310C. In this embodiment, in the panel base 120P, six regions of the scheduled light emission regions 55-11, 55-22, 55-23, 55-32, 55-33, and 55-41 are selected as the light emission regions while any other region is unselected as the light emission region (i.e., light is not emitted).

As described above, such that a maximum of two surface light emission modules can be connected to each of the first constant current series connection line DL1 connected to the first power supply B1, the second constant current series connection line DL2 connected to the second power supply B2, and the third constant current series connection line DL3 connected to the third power supply B3, power supply capacity of the first power supply B1, the second power supply B2, and the third power supply B3 is designed.

The first surface light emission module 310A is installed in the scheduled light emission region 55-11 of the panel base 120P. Accordingly, in a region of the scheduled light emission region 55-11, the first contact point 50B1 of the input connecting connector 50B is connected to the first contact point 60B1 of the wiring connector 60C, and the first contact point 50C1 of the output connecting connector 50C is connected to the first contact point 60C1 of the wiring connector 60C. Accordingly, the first switching member SW1 is switched from the on state to the off state, whereby the electric current of the first constant current series connection line DL1 flows in the surface light emission panel 10. The second switching member SW2 and the third switching member SW3 continue to be in the on state, whereby the electric current of the second constant current series connection line DL2 and the electric current of the third constant current series connection line DL3 can be supplied to the adjacent non-emission scheduled light emission region 55-12.

Next, in the non-emission scheduled light emission region 55-12, all of the switching members are in the on state. Thus, each of the power from the first power supply B1, the second power supply B2, and the third power supply B3 supplied to the scheduled light emission region 55-11 passes through the scheduled light emission region 55-12 and can be supplied to the adjacent to scheduled light emission region 55-13.

In the same way as the above, the first surface light emission module 310A is installed in the scheduled light emission region 55-22. The second surface light emission module 310B is installed in each of the scheduled light emission regions 55-23 and 55-33, and the third surface light emission module 310C is installed in each of the scheduled light emission regions 55-32 and 55-41. Any other unselected scheduled light emission region is left in a state as it is.

By completing a connection state as described above, the first constant current series connection line DL1 connected to the first power supply B1, the second constant current series connection line DL2 connected to the second power supply B2, and the third constant current series connection line DL3 connected to the third power supply B3 are constituted, whereby the selected region is caused to emit light by the surface light emission panel, and the power is passed in an unselected power supply line in the selected scheduled light emission region as well as in the unselected scheduled light emission region.

Furthermore, provided that the number of the surface light emission modules is within the number thereof connectable to each of the constant current series connection lines, it is possible to cause the surface light emission module to emit light by installing the surface light emission module in an arbitrary position not limited to positions illustrated in FIG. 23 without changing a wiring structure.

Furthermore, by using a series connection line using a constant current power supply as a power supply, provided that the number of the surface light emission modules is within a range of the number thereof determined in advance, it is possible to make an electric current flowing in the series connection line (power supply line) constant regardless of the number thereof.

Furthermore, in a case where six surface light emission panels are provided to one series connection line, power supply wiring becomes thick; however, as described in this embodiment, it is possible to make each of the power supply wiring thin by dividing it into three series connection lines, whereby wiring handling may be made easy.

The illumination device 300 according to this embodiment does not require the non-emission dummy panel as described in the second embodiment, and it is capable of causing the surface light emission module to emit light by only installing the surface light emission module to a selected part.

Note that in this embodiment, a case in which the button switch is used as the switching member is described; however, any switching member may be used as long as it is configured such that the switching member is switched from the on state to the off state by installing the surface light emission module. For example, it is also possible to switch from the on state to the off state by using a photoreflector as the switching member and by covering the photoreflector.

As above, the illumination device according to each of the second and third embodiments described above has a configuration in which the scheduled light emission region is specified, a plurality of constant current series connection lines required is wired in each of the scheduled light emission regions in advance, one of the plurality of constant current series connection lines is selected when installing the surface light emission module, the surface light emission panel is serially connected to the constant current series connection line that has been selected, and an electric current passes through any other constant current series connection line. Accordingly, it is possible to easily make the selected region to emit light by the surface light emission panel. Furthermore, in a case where a position of the surface light emission module is changed, it is possible to change the position of the surface light emission module easily without changing wiring.

Note that in the second and third embodiments described above, three constant current series connection lines are provided; however, the number thereof may be two or may be four or more. An arrangement configuration of the surface light emission module is not limited to a rectangle of five rows by four columns; it is possible to use various arrangement configurations such as a circular shape, a spiral shape, and the like.

As above, the illumination device according to each of the embodiments of the present invention has been described; however, it is to be considered that the embodiments disclosed herein are exemplary in all respects and are not restricting. Thus, the scope of the present invention is intended to be described in claims and to include all modifications within the claims and within meaning equivalent to the claims.

REFERENCE SIGNS LIST 10 surface light emission panel, 11 transparent substrate, 12 light emission surface, 13 back face, 14 positive pole, 15 organic layer, 16 negative pole, 17 sealing member, 18 insulation layer, 19 back face, 21, 22 electrode unit, 31 surface light emission unit, 50, 55 scheduled light emission region, 50B1, 50C1, 60B1, 60C1 first contact point, 50B2, 50C2, 60B2, 60C2 second contact point, 50B3, 50C3, 60B3, 60C3 third contact point, 50B input connecting connector, 50C output connecting connector, 60B, 60C wiring connector, 100, 200, 300 illumination device, 100P, 110P, 120P panel base, 200A surface light emission module, 210A, 310A first surface light emission module, 210B, 310B second surface light emission module, 210C, 310C third surface light emission module, 200D, 210D connection panel, B1 first power supply, B2 second power supply, B3 third power supply, BT1, B12, B13 protrusion, D10 panel, DL series connection line, DL1 first constant current series connection line, DL2 second constant current series connection line, DL3 third constant current series connection line, L1 wiring line, L11 first light emission line, L12 eleventh connection line, L13 twelfth connection line, L21 twenty first connection line, L22 second light emission line, L23 twenty second connection line, L31 thirty first connection line, L32 thirty second connection line, L33 third light emission line, L41 first connection line, L42 second connection line, L43 third connection line, SW1 first switching member, SW2 second switching member, and SW3 third switching member.

The invention claimed is:

1. An illumination device comprising:
one or more surface light emission modules including a surface light emission panel emitting light by being supplied with power;
a panel base partitioned into two or more scheduled light emission regions and configured to make the surface light emission panel to emit light by installing the surface light emission module in the selected scheduled light emission region;
a power passing means configured to pass the power from the adjacent scheduled light emission region; and
a power supply configured to supply the power to the surface light emission panel, wherein
each of the scheduled light emission regions has a base power input unit and a base power output unit, and by the base power output unit being connected to the base power input unit between adjacent scheduled light emission regions, a series connection line is constituted of the power supply and the two or more scheduled light emission regions, the surface light emission module includes a panel power input unit connected to the base power input unit and a panel power output unit connected to the base power output unit for supplying the power to the surface light emission panel, and the power passing means passes the power from the adjacent scheduled light emission region by directly connecting the base power input unit to the base power output unit.

2. The illumination device according to claim 1, wherein the power supply is a constant current power supply, and the constant current power supply and the two or more scheduled light emission regions constitute a constant current series connection line.

3. The illumination device according to claim 2, wherein the power supply includes a first constant current power supply and a second constant current power supply, and a first constant current series connection line connected to the first constant current power supply and a second constant current series connection line connected to the second constant current power supply are disposed in parallel to each other.

4. The illumination device according to claim 3, wherein the base power input unit includes a first base power input unit and a second base power input unit, the base power output unit includes a first base power output unit and a second base power output unit, the first constant current power supply, the first base power input unit, and the first base power output unit constitute the first constant current series connection line, the second constant current power supply, the second base power input unit, and the second base power output unit constitute the second constant current series connection line, the surface light emission module includes a first surface light emission module and a second surface light emission module, wherein the first surface light emission module includes:

a first light emission line connected to the first constant current series connection line and supplying power to the surface light emission panel in a state where the first surface light emission module is installed in the scheduled light emission region; and a first connection line connected to the second constant current series connection line and constituting the power passing means by directly connecting the second base power input unit to the second base power output unit, and the second surface light emission module includes:

a second connection line connected to the first constant current series connection line in a state where the second surface light emission module is installed in the scheduled light emission region and constituting the power passing means by directly connecting the first base power input unit to the first base power output unit; and a second light emission line connected to the second constant current series connection line and supplying power to the surface light emission panel, and the surface light emission module further includes a connection panel as the power passing means having, in a state where installed in the scheduled light emission region, a first connection line connected to the first constant current series connection line and directly connecting the first base power input unit to the first base power output unit, and a second connection line connected to the second constant current series connection line and directly connecting the second base power input unit to the second base power output unit.

5. The illumination device according to claim 4, wherein the connection panel includes a non-emission dummy panel having the same shape as that of the surface light emission module.

6. The illumination device according to claim 3, further comprising:

a first switching member as a power passing means connected to the first constant current power supply and a second switching member as a power passing means connected to the second constant current power supply provided between the base power input unit and the base power output unit, wherein the first constant current power supply and the first switching member constitute the first constant current series connection line, and the second constant current power supply and the second switching member constitute the second constant current series connection line, wherein the surface light emission module includes a first surface light emission module and a second surface light emission module, wherein the first surface light emission module includes a first switching means switching the first switching member from an on state to an off state and allowing an electric current of the first constant current series connection line to flow in the surface light emission panel by releasing the power passing means in a state where the first surface light emission module is installed in the scheduled light emission region, and the second surface light emission module includes a second switching means switching the second switching member from an on state to an off state by approaching the second switching member and allowing an electric current of the second constant current series connection line to flow in the surface light emission panel by releasing the power passing means in a state where the second surface light emission module is installed in the scheduled light emission region.

7. A surface light emission module comprising a first surface light emission module emitting light by being installed in a scheduled light emission region of a base panel being partitioned into two or more scheduled light emission regions, wherein the first surface light emission module includes:

a first light emission line, in a state where the first surface light emission module is installed in the scheduled light emission region, connected to a first constant current series connection line constituted of a first constant current power supply, a first base power input unit of the base panel, and a first base power output unit of the base panel and supplying power to the first surface light emission module; and a first connection line, in a state where the first surface light emission module is installed in the scheduled light emission region, connected to a second constant current series connection line constituted of a second constant current power supply, a second base power input unit of the base panel, and a second base power output unit of the base panel and allowing power from an adjacent scheduled light emission region to pass through by directly connecting the second base power input unit to the second base power output unit.

8. The surface light emission module according to claim 7, wherein
the surface light emission module includes a second surface light emission module, wherein
the second surface light emission module includes:
a second connection line, in a state where the second surface light emission module is installed in the scheduled light emission region, connected to the first constant current series connection line and allowing the power from the adjacent scheduled light emission region to pass through by directly connecting the first base power input unit to the first base power output unit; and
a second light emission line, in a state where it is installed in the scheduled light emission region, connected to the second constant current series connection line and supplying the power to the second surface light emission module.

* * * * *